(12) United States Patent
Luo et al.

(10) Patent No.: US 8,663,764 B2
(45) Date of Patent: Mar. 4, 2014

(54) OVERMOLDED COMPOSITE STRUCTURE FOR AN ELECTRONIC DEVICE

(71) Applicant: Ticona LLC, Florence, KY (US)

(72) Inventors: Rong Luo, Florence, KY (US); Xinyu Zhao, Cincinnati, OH (US)

(73) Assignee: Ticona LLC, Florence, KY (US)

( * ) Notice: Subject to any disclaimer, the term of this patent is extended or adjusted under 35 U.S.C. 154(b) by 0 days.

(21) Appl. No.: 13/621,874

(22) Filed: Sep. 18, 2012

(65) Prior Publication Data

US 2013/0071638 A1    Mar. 21, 2013

Related U.S. Application Data

(60) Provisional application No. 61/536,710, filed on Sep. 20, 2011.

(51) Int. Cl.
*B29D 22/00* (2006.01)

(52) U.S. Cl.
USPC .................. 428/35.8; 428/301.1; 312/223.2

(58) Field of Classification Search
USPC ................ 428/35.8, 301.1, 34.1; 312/223.2
See application file for complete search history.

(56) References Cited

U.S. PATENT DOCUMENTS

| | | | |
|---|---|---|---|
| 3,725,362 A | 4/1973 | Walker | |
| 3,729,404 A | 4/1973 | Morgan | |
| 4,021,596 A | 5/1977 | Bailey | |
| 4,119,617 A | 10/1978 | Hanyuda et al. | |
| 4,276,397 A | 6/1981 | Froix | |
| 4,605,713 A | 8/1986 | Heitz et al. | |
| 4,678,831 A | 7/1987 | Kawabata et al. | |
| 4,760,128 A | 7/1988 | Ebert et al. | |
| 4,769,424 A | 9/1988 | Takekoshi et al. | |
| 4,820,801 A | 4/1989 | Inoue et al. | |
| 4,889,893 A | 12/1989 | Kobayashi et al. | |
| 4,935,473 A | 6/1990 | Fukuda et al. | |
| 5,015,703 A | 5/1991 | Takekoshi et al. | |
| 5,015,704 A | 5/1991 | Takekoshi et al. | |
| 5,047,465 A | 9/1991 | Auerbach | |
| 5,057,264 A | 10/1991 | Bier et al. | |
| 5,068,312 A | 11/1991 | Dorf et al. | |
| 5,070,127 A | 12/1991 | Auerbach | |
| 5,122,578 A | 6/1992 | Han et al. | |

(Continued)

FOREIGN PATENT DOCUMENTS

| | | |
|---|---|---|
| CN | 101768358 | 7/2010 |
| CN | 102140233 | 8/2011 |

(Continued)

OTHER PUBLICATIONS

Jun. 6, 2013 International Search Report and Written Opinion of application PCT/US2012/055858.

*Primary Examiner* — N. Edwards
(74) *Attorney, Agent, or Firm* — Dority & Manning, P.A.

(57) ABSTRACT

An overmolded composite structure that contains a metal component and a resinous component adhered to a surface thereof is provided. The resinous component is formed from a thermoplastic composition that contains at least one polyarylene sulfide and at least one mineral filler. The present inventors have discovered that the nature and relative concentration of the polyarylene sulfides, mineral fillers, and/or other materials in the thermoplastic composition can be selectively tailored so that the resulting resinous component has a coefficient of linear thermal expansion and/or color that is similar to the metal component.

37 Claims, 2 Drawing Sheets

(56) References Cited

U.S. PATENT DOCUMENTS

| | | |
|---|---|---|
| 5,151,458 A | 9/1992 | Heinz et al. |
| 5,182,334 A | 1/1993 | Chen, Sr. et al. |
| 5,218,043 A | 6/1993 | Kubota et al. |
| 5,227,427 A | 7/1993 | Seizawa et al. |
| 5,276,107 A | 1/1994 | Kim et al. |
| 5,384,196 A | 1/1995 | Inoue et al. |
| 5,418,281 A | 5/1995 | Yung et al. |
| 5,436,300 A | 7/1995 | Kashiwadate et al. |
| 5,488,084 A | 1/1996 | Kadoi et al. |
| 5,504,141 A | 4/1996 | Collard et al. |
| 5,541,243 A | 7/1996 | Ohmura et al. |
| 5,652,287 A | 7/1997 | Sullivan et al. |
| 5,654,383 A | 8/1997 | Kohler et al. |
| 5,679,284 A | 10/1997 | Kurita |
| 5,780,583 A | 7/1998 | Lubowitz et al. |
| 5,959,071 A | 9/1999 | DeMoss et al. |
| 5,981,007 A | 11/1999 | Rubin et al. |
| 5,997,765 A | 12/1999 | Furuta et al. |
| 6,001,934 A | 12/1999 | Yamanaka et al. |
| 6,010,760 A | 1/2000 | Miyazaki et al. |
| 6,080,822 A | 6/2000 | Haubs et al. |
| 6,117,950 A | 9/2000 | Yamao et al. |
| 6,130,292 A | 10/2000 | Harwood et al. |
| 6,201,098 B1 | 3/2001 | Haubs et al. |
| 6,280,668 B1 | 8/2001 | Saito et al. |
| 6,317,314 B1 | 11/2001 | Kung et al. |
| 6,339,400 B1 | 1/2002 | Flint et al. |
| 6,476,106 B1 | 11/2002 | Murakami et al. |
| 6,608,136 B1 | 8/2003 | Dean et al. |
| 6,645,623 B2 | 11/2003 | Dean et al. |
| 6,699,946 B1 | 3/2004 | Lambla et al. |
| 6,730,378 B2 | 5/2004 | Matsuoka et al. |
| 6,793,847 B2 | 9/2004 | Maeda et al. |
| 6,830,792 B1 | 12/2004 | Matsuoka et al. |
| 6,875,517 B2 | 4/2005 | Bosshammer et al. |
| 6,889,719 B2 | 5/2005 | Watanabe et al. |
| 6,900,272 B2 | 5/2005 | Matsuoka et al. |
| 6,960,628 B2 | 11/2005 | Matsuoka et al. |
| 7,115,312 B2 | 10/2006 | Matsuoka et al. |
| 7,118,691 B2 | 10/2006 | Elkovitch et al. |
| 7,169,887 B2 | 1/2007 | Papke |
| 7,235,612 B2 | 6/2007 | Kobayashi et al. |
| 7,271,769 B2 | 9/2007 | Asano et al. |
| 7,301,783 B2 | 11/2007 | Homer et al. |
| 7,303,822 B1 | 12/2007 | Matsuoka et al. |
| 7,385,806 B2 | 6/2008 | Liao |
| 7,462,672 B2 | 12/2008 | Kobayashi et al. |
| 7,486,243 B2 | 2/2009 | Wulff et al. |
| 7,486,517 B2 | 2/2009 | Aapro et al. |
| 7,518,568 B2 | 4/2009 | Tracy et al. |
| 7,553,925 B2 | 6/2009 | Bojkova |
| 7,608,666 B2 | 10/2009 | Matsuoka et al. |
| 7,960,473 B2 | 6/2011 | Kobayashi et al. |
| 7,974,660 B2 | 7/2011 | Hsu et al. |
| 7,989,079 B2 | 8/2011 | Lee et al. |
| 8,005,429 B2 | 8/2011 | Conway et al. |
| 8,026,309 B2 | 9/2011 | Halahmi et al. |
| 8,044,142 B2 | 10/2011 | Akiyama et al. |
| 8,076,423 B2 | 12/2011 | Ishio et al. |
| 8,152,071 B2 | 4/2012 | Doherty et al. |
| 8,168,732 B2 | 5/2012 | Ajbani et al. |
| 8,258,242 B2 | 9/2012 | Hiroi et al. |
| 8,338,547 B2 | 12/2012 | Takahashi et al. |
| 8,367,210 B2 | 2/2013 | Naritomi et al. |
| 8,394,507 B2 * | 3/2013 | Tomantschger et al. ...... 428/626 |
| 8,426,552 B2 | 4/2013 | Hinokimori et al. |
| 8,462,054 B2 | 6/2013 | Yang et al. |
| 8,512,839 B2 * | 8/2013 | Yung ........................ 428/36.9 |
| 2003/0050091 A1 | 3/2003 | Tsai et al. |
| 2004/0257283 A1 | 12/2004 | Asano et al. |
| 2005/0104190 A1 | 5/2005 | Mithal et al. |
| 2006/0257624 A1 | 11/2006 | Naritomi et al. |
| 2009/0011163 A1 | 1/2009 | Ajbani |
| 2009/0267266 A1 | 10/2009 | Lee et al. |
| 2009/0280347 A1 | 11/2009 | Yu |
| 2010/0048777 A1 | 2/2010 | Kodama et al. |
| 2010/0249342 A1 | 9/2010 | Unohara et al. |
| 2011/0037193 A1 | 2/2011 | Takada et al. |
| 2011/0089792 A1 | 4/2011 | Casebolt et al. |
| 2011/0090630 A1 | 4/2011 | Bergerone et al. |
| 2011/0134012 A1 | 6/2011 | Yang et al. |
| 2011/0169700 A1 | 7/2011 | Degner et al. |
| 2012/0065361 A1 | 3/2012 | Konno et al. |
| 2012/0237714 A1 | 9/2012 | Nishikawa et al. |
| 2013/0035440 A1 | 2/2013 | Nishikawa et al. |
| 2013/0059976 A1 | 3/2013 | Matsuo et al. |
| 2013/0069001 A1 | 3/2013 | Luo et al. |
| 2013/0071638 A1 * | 3/2013 | Luo et al. ..................... 428/212 |
| 2013/0072629 A1 | 3/2013 | Luo et al. |
| 2013/0072630 A1 | 3/2013 | Luo et al. |
| 2013/0155597 A1 * | 6/2013 | Luo et al. ................. 361/679.26 |
| 2013/0158212 A1 * | 6/2013 | Luo et al. ..................... 525/537 |
| 2013/0196170 A1 * | 8/2013 | Tomantschger et al. ...... 428/551 |
| 2013/0225771 A1 | 8/2013 | Kanomata et al. |
| 2013/0249357 A1 | 9/2013 | Luo et al. |

FOREIGN PATENT DOCUMENTS

| | | |
|---|---|---|
| CN | 102181156 | 9/2011 |
| CN | 102532898 | 7/2012 |
| DE | 3813919 | 11/1989 |
| DE | 4138906 | 6/1993 |
| EP | 0405135 | 1/1991 |
| EP | 0432561 | 6/1991 |
| EP | 0546185 | 6/1993 |
| EP | 0549977 | 7/1993 |
| EP | 0568945 | 11/1993 |
| JP | 03-231969 A | 10/1991 |
| JP | 05-086266 A | 4/1993 |
| JP | 05-179097 A | 7/1993 |
| JP | 05-230371 A | 9/1993 |
| JP | 08-151518 A | 6/1996 |
| JP | 11-140315 A | 5/1999 |
| JP | 2980054 B | 11/1999 |
| JP | 3034335 B | 4/2000 |
| JP | 2001-172501 A | 6/2001 |
| JP | 3227729 B | 11/2001 |
| JP | 2004-182754 A | 7/2004 |
| JP | 3579957 B | 10/2004 |
| JP | 3601090 B | 12/2004 |
| JP | 3837715 B | 4/2005 |
| JP | 3800783 B | 7/2006 |
| JP | 2006-316207 A | 11/2006 |
| JP | 3867549 B | 1/2007 |
| JP | 2007-197714 A | 8/2007 |
| JP | 2007-277292 A | 10/2007 |
| JP | 4038607 B | 1/2008 |
| JP | 4129674 B | 8/2008 |
| JP | 4196647 B | 12/2008 |
| JP | 2009-256480 A | 11/2009 |
| JP | 2009-263635 A | 11/2009 |
| JP | 2010-053356 A | 3/2010 |
| JP | 2010-084125 A | 4/2010 |
| JP | 4495261 B | 6/2010 |
| JP | 2010-195874 A | 9/2010 |
| JP | 4552315 B | 9/2010 |
| JP | 4943399 B | 5/2012 |
| JP | 5029851 B | 9/2012 |
| JP | 5029881 B | 9/2012 |
| WO | WO 2009/033349 | 3/2009 |

\* cited by examiner

OVERMOLDED COMPOSITE STRUCTURE FOR AN ELECTRONIC DEVICE

CROSS REFERENCE TO RELATED APPLICATION

The present application claims filing benefit of U.S. Provisional Patent Application Ser. No. 61/536,710 having a filing date of Sep. 20, 2011, which is incorporated herein by reference.

BACKGROUND OF THE INVENTION

Wireless electronic devices, such as notebook computers, mobile phones, and personal digital assistants (PDAs) typically employ an antenna for receiving and/or transmitting communication signals. Antennas have been mounted both externally and internally, but certain problems are associated with each approach. For example, mounting an antenna externally can create a less desirable form factor as well as increase the vulnerability of the antenna to damage from contact with external objects. On the other hand, mounting the antenna internally within the device can also be problematic due to space constraints and due to interference with transmission of the wireless signal. For example, metals (e.g., magnesium-aluminum alloys) are often employed in the construction of the device housing due to their stylish appearance and good surface feel. Because these metals exhibit electromagnetic interference ("EMI") shielding, however, a portion of the housing must generally be made of plastic so that signals can be received and transmitted through the housing. This has been accomplished, for instance, by covering the antenna with a plastic component.

While helping to solve the problem of EMI shielding, the presence of the plastic component can lead to various additional problems. For example, because it is visible from the exterior of the device, the housing is often surface coated with a paint to help better match its color to that of the metal. This also helps to bond together the metal and plastic materials. Unfortunately, most plastic materials have a significantly different color than metals, which results in the need for a significant number of coatings to achieve the desired color. Moreover, the housing is also typically heated during application of a surface coating. Due to the significantly different thermal characteristics of the plastic and metal, however, such heating can result in a poor surface interface between the materials. This poor interface contributes to the need for an additional number of surface coatings to help achieve good bonding between the materials and a uniform appearance.

As such, a need currently exists for a material that is able to better match both the color and thermal characteristics of metals used in forming composite structures of electronic devices.

SUMMARY OF THE INVENTION

In accordance with one embodiment of the present invention, an overmolded composite structure for an electronic device is disclosed. The overmolded composite structure comprises a metal component that defines a surface and a resinous component that is adhered to the surface of the metal component. The resinous component is formed from a thermoplastic composition that comprises a polyarylene sulfide and a mineral filler, wherein the ratio of the coefficient of linear thermal expansion of the resinous component to the coefficient of linear thermal expansion of the metal component is from about 0.5 to about 1.5.

In accordance with another embodiment of the present invention, an electronic device is disclosed that includes a housing that contains an overmolded composite structure. The overmolded composite structure comprises a metal component that defines a surface and a resinous component that is adhered to the surface of the metal component. The resinous component is formed from a thermoplastic composition that comprises a polyarylene sulfide and a mineral filler, wherein the ratio of the coefficient of linear thermal expansion of the resinous component to the coefficient of linear thermal expansion of the metal component is from about 0.5 to about 1.5.

Other features and aspects of the present invention are set forth in greater detail below.

BRIEF DESCRIPTION OF THE FIGURES

A full and enabling disclosure of the present invention, including the best mode thereof to one skilled in the art, is set forth more particularly in the remainder of the specification, including reference to the accompanying figures, in which.

DETAILED DESCRIPTION

Figure 1:
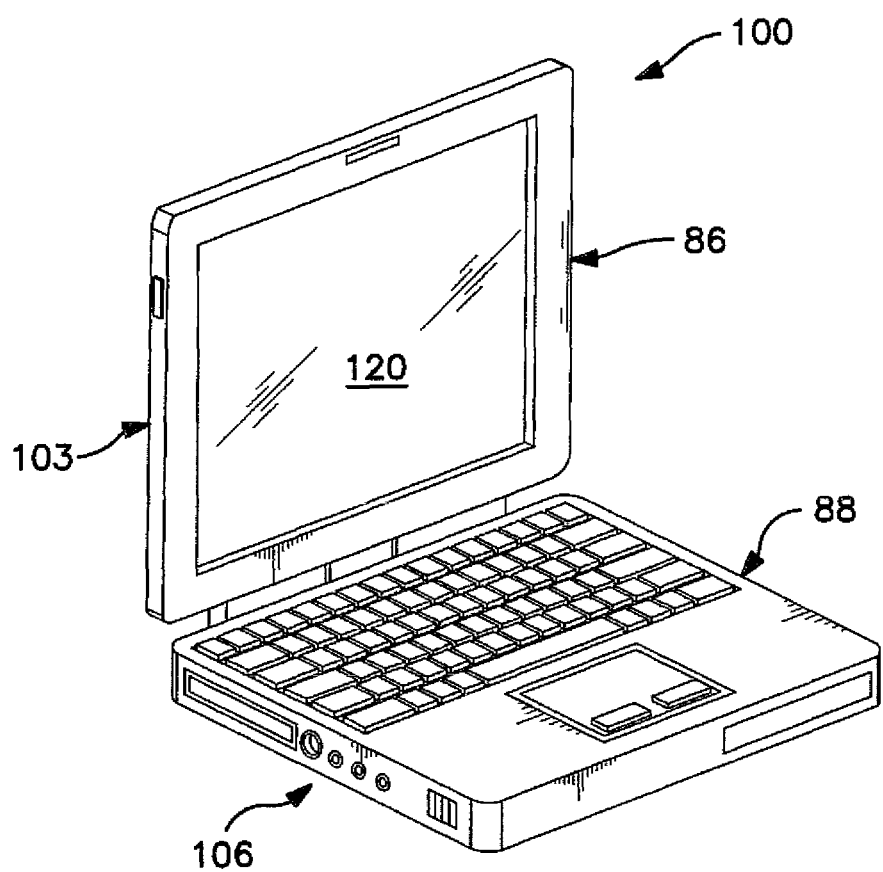
FIG. 1 is a perspective view of an electronic device that contains an overmolded composite structure in accordance with one embodiment of the present invention.

It is to be understood by one of ordinary skill in the art that the present discussion is a description of exemplary embodiments only, and is not intended as limiting the broader aspects of the present invention.

Generally speaking, the present invention is directed to an overmolded composite structure that contains a metal component and a resinous component adhered to a surface thereof. The resinous component is formed from a thermoplastic composition that contains at least one polyarylene sulfide and at least one mineral filler. The present inventors have discovered that the nature and relative concentration of the polyarylene sulfides, mineral fillers, and/or other materials in the thermoplastic composition can be selectively tailored so that the resulting resinous component has a coefficient of linear thermal expansion and/or color that is similar to the metal component. For example, the coefficient of linear thermal expansion of the resinous component may range from about 10 $\mu m/m° C.$ to about 35 $\mu m/m° C.$, in some embodiments from about 16 $\mu m/m° C.$ to about 32 $\mu m/m° C.$, and in some embodiments, from 18 $\mu m/m° C.$ to about 30 $\mu m/m° C.$, as determined in accordance with ISO 11359-2: 1999 in the flow direction (parallel). Further, the ratio of the coefficient of linear thermal expansion of the resinous component to the coefficient of linear thermal expansion of the metal component may be from about 0.5 to about 1.5, in some embodiments from about 0.6 to about 1.2, and in some embodiments, from about 0.6 to about 1.0. For example, the coefficient of linear thermal expansion of a magnesium-aluminum alloy is about 27 $\mu m/m° C.$ The color of the resinous component may also be relatively similar to the metal component. This similarity in color can be quantified by measuring the absorbance with an optical reader in accordance with a standard test methodology known as "CIELAB", which is described in Pocket Guide to Digital Printing by F. Cost, Delmar Publishers, Albany, N.Y. ISBN 0-8273-7592-1 at pages 144 and 145 and "Photoelectric color difference meter", Journal of Optical Society of America, volume 48, page numbers 985-995, S. Hunter, (1958), both of which are incorporated herein by reference in their entirety. More specifically, the CIELAB test method defines three "Hunter" scale values, L*, a*, and b*, which correspond to three characteristics of a perceived color based on the opponent theory of color perception and are defined as follows:

L*=Lightness (or luminosity), ranging from 0 to 100, where 0=dark and 100=light;

a*=Red/green axis, ranging from −100 to 100; positive values are reddish and negative values are greenish; and b*=Yellow/blue axis, ranging from −100 to 100; positive values are yellowish and negative values are bluish.

Because CIELAB color space is somewhat visually uniform, a single number may be calculated that represents the total absolute color difference between two colors as perceived by a human using the following equation:

$$\Delta E = [(\Delta L^*)^2 + (\Delta a^*)^2 + (\Delta b^*)^2]^{1/2}$$

wherein, $\Delta L^*$ is the luminosity value of a first color subtracted from the luminosity value of a second color, $\Delta a^*$ is the red/green axis value of the first color subtracted from the red/green axis value of the second color; and $\Delta b^*$ is the yellow/blue axis value of the first color subtracted from the yellow/blue axis value of the second color. In CIELAB color space, each $\Delta E$ unit is approximately equal to a "just noticeable" difference between two colors and is therefore a good measure for an objective device-independent color specification system that may be used for the purpose of expressing differences in color. For instance, the "first color" in the formula above may represent the color of the metal component (before and/or after any optional surface treatments) and the "second color" may represent the color of the resinous component. Due to the relatively close color between the resinous and metal components, the resulting $\Delta E$ values are typically small, such as about 12 or less, in some embodiments about 11 or less, in some embodiments, from about 0.5 to about 8, and in some embodiments, from about 1 to about 6.

The resinous component can exhibit other beneficial characteristics as well. For instance, the resinous component can exhibit good heat resistance and flame retardant characteristics. For example, the resinous component can meet the V-0 flammability standard at a thickness of 0.8 millimeters. The flame retarding efficacy may be determined according to the UL 94 Vertical Burn Test procedure of the "Test for Flammability of Plastic Materials for Parts in Devices and Appliances", 5th Edition, Oct. 29, 1996. The ratings according to the UL 94 test are listed in the following table:

TABLE 1

| Rating | Afterflame Time (s) | Burning Drips | Burn to Clamp |
|---|---|---|---|
| V-0 | <10 | No | No |
| V-1 | <30 | No | No |
| V-2 | <30 | Yes | No |
| Fail | <30 | | Yes |
| Fail | >30 | | No |

The "afterflame time" is an average value determined by dividing the total afterflame time (an aggregate value of all samples tested) by the number of samples. The total afterflame time is the sum of the time (in seconds) that all the samples remained ignited after two separate applications of a flame as described in the UL-94 VTM test. Shorter time periods indicate better flame resistance, i.e., the flame went out faster. For a V-0 rating, the total afterflame time for five (5) samples, each having two applications of flame, must not exceed 50 seconds. Using the flame retardant of the present invention, articles may achieve at least a V-1 rating, and typically a V-0 rating, for specimens having a thickness of 0.8 millimeters.

As indicated, a variety of aspects of the thermoplastic composition used to form the resinous component may be selectively tailored to achieve the desired thermal properties and color as noted. For example, the ratio of polyarylene sulfide(s) to mineral filler(s) typically ranges from about 0.5 to about 5, in some embodiments, from about 0.8 to about 4, and in some embodiments, from about 1 to about 2. Mineral filler(s) may, for instance, constitute from about 5 wt. % to about 50 wt. %, in some embodiments from about 10 wt. % to about 45 wt. %, and in some embodiments, from about 20 wt. % to about 40 wt. % of the composition. Likewise, polyarylene sulfide(s) may constitute from about 20 wt. % to about 70 wt. %, in some embodiments from about 30 wt. % to about 65 wt. %, and in some embodiments, from about 45 wt. % to about 60 wt. % of the composition.

The nature of the mineral filler(s) may also help achieve the desired thermal properties and/or color. Clay minerals, for instance, may be particularly suitable for use in the present invention. Examples of such clay minerals include, for instance, talc ($Mg_3Si_4O_{10}(OH)_2$), halloysite ($Al_2Si_2O_5(OH)_4$), kaolinite ($Al_2Si_2O_5(OH)_4$), illite (($K,H_3O$)($Al,Mg,Fe$)$_2$ ($Si,Al$)$_4O_{10}$[($OH$)$_2$,($H_2O$)]), montmorillonite (($Na,Ca$)$_{0.33}$($Al,Mg$)$_2Si_4O_{10}(OH)_2 \cdot nH_2O$), vermiculite (($MgFe,Al$)$_3$($Al,Si$)$_4O_{10}(OF)_2 \cdot 4H_2O$), palygorskite (($Mg,Al$)$_2Si_4O_{10}(OH) \cdot 4(H_2O)$), pyrophyllite ($Al_2Si_4O_{10}(OH)_2$), etc., as well as combinations thereof. Magnesium-based clay minerals (e.g., talc) are particularly desirable as they are more apt to share a similar color and/or coefficient of linear thermal expansion to the magnesium-based alloys (e.g., Mg—Al alloy) often used for the metal component. In lieu of, or in addition to, clay minerals, still other mineral fillers may also be employed. For example, other suitable silicate fillers may also be employed, such as calcium silicate, aluminum silicate, mica, diatomaceous earth, wollastonite, and so forth. Mica, for instance, may be a particularly suitable mineral for use in the present invention. There are several chemically distinct mica species with considerable variance in geologic occurrence, but all have essentially the same crystal structure. As used herein, the term "mica" is meant to generically include any of these species, such as muscovite ($KAl_2(AlSi_3)O_{10}(OH)_2$), biotite ($K(Mg,Fe)_3(AlSi_3)O_{10}(OH)_2$), phlogopite ($KMg_3(AlSi_3)O_{10}(OH)_2$), lepidolite ($K(Li,Al)_{2-3}(AlSi_3)O_{10}(OH)_2$), glauconite (($K,Na$)($Al,Mg,Fe$)$_2$($Si,Al$)$_4O_{10}(OH)_2$), etc., as well as combinations thereof. Magnesium-based mica fillers (e.g., phlogopite) may be particularly suitable, such as those commercially available from Imerys Performance Minerals (e.g., Suzorite® 200-HK). To help achieve good melt flowability of the composition, the median particle size of the filler(s) is typically relatively small, such as from about 25 μm to about 100 μm, and in some embodiments, from about 30 μm to about 70 μm.

In certain embodiments, a blend of mineral fillers may be employed to help achieve the properties of the composition. For instance, talc may be employed in combination with another silicate filler, such as mica. In such embodiments, the weight ratio of talc to other fillers is typically from about 0.5 to about 1.5, in some embodiments from about 0.6 to about 1.4, and in some embodiments, from about 0.8 to about 1.2. For example, talc may constitute from about 4 wt. % to about 30 wt. %, in some embodiments from about 5 wt % to about 25 wt. %, and in some embodiments from about 10 wt. % to about 20 wt. % of the composition. Likewise, other silicate fillers (e.g., mica) may also constitute from about 4 wt. % to about 30 wt. %, in some embodiments from about 5 wt. % to about 25 wt. %, and in some embodiments from about 10 wt. % to about 20 wt. % of the composition.

Because the composite structure of the present invention is generally employed in electronic devices, it is generally desired that the polyarylene sulfide(s) in the thermoplastic composition are able to withstand relatively high temperatures without melting. In this regard, the polyarylene sulfide(s) will typically have a relatively high melting temperature, such as from about 200° C. to about 500° C., in some embodiments from about 225° C. to about 400° C., and in some embodiments, from about 250° C. to about 350° C. The polyarylene sulfide(s) generally have repeating units of the formula:

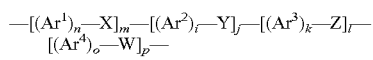

wherein, $Ar^1$, $Ar^2$, $Ar^3$, and $Ar^4$ are independently arylene units of 6 to 18 carbon atoms;

W, X, Y, and Z are independently bivalent linking groups selected from —$SO_2$—, —S—, —SO—, —CO—, —O—, —C(O)O— or alkylene or alkylidene groups of 1 to 6 carbon atoms, wherein at least one of the linking groups is —S—; and n, m, i, j, k, l, o, and p are independently 0, 1, 2, 3, or 4, subject to the proviso that their sum total is not less than 2.

The arylene units $Ar^1$, $Ar^2$, $Ar^3$, and $Ar^4$ may be selectively substituted or unsubstituted. Advantageous arylene units are phenylene, biphenylene, naphthylene, anthracene and phenanthrene. The polyarylene sulfide typically includes more than about 30 mol %, more than about 50 mol %, or more than about 70 mol % arylene sulfide (—S—) units. For example, the polyarylene sulfide may include at least 85 mol % sulfide linkages attached directly to two aromatic rings. In one particular embodiment, the polyarylene sulfide is a polyphenylene sulfide, defined herein as containing the phenylene sulfide structure —$(C_6H_4—S)_n$— (wherein n is an integer of 1 or more) as a component thereof.

Synthesis techniques that may be used in making a polyarylene sulfide are generally known in the art. By way of example, a process for producing a polyarylene sulfide can include reacting a material that provides a hydrosulfide ion (e.g., an alkali metal sulfide) with a dihaloaromatic compound in an organic amide solvent. The alkali metal sulfide can be, for example, lithium sulfide, sodium sulfide, potassium sulfide, rubidium sulfide, cesium sulfide or a mixture thereof. When the alkali metal sulfide is a hydrate or an aqueous mixture, the alkali metal sulfide can be processed according to a dehydrating operation in advance of the polymerization reaction. An alkali metal sulfide can also be generated in situ. In addition, a small amount of an alkali metal hydroxide can be included in the reaction to remove or react impurities (e.g., to change such impurities to harmless materials) such as an alkali metal polysulfide or an alkali metal thiosulfate, which may be present in a very small amount with the alkali metal sulfide.

The dihaloaromatic compound can be, without limitation, an o-dihalobenzene, m-dihalobenzene, p-dihalobenzene, dihalotoluene, dihalonaphthalene, methoxy-dihalobenzene, dihalobiphenyl, dihalobenzoic acid, dihalodiphenyl ether, dihalodiphenyl sulfone, dihalodiphenyl sulfoxide or dihalodiphenyl ketone. Dihaloaromatic compounds may be used either singly or in any combination thereof. Specific exemplary dihaloaromatic compounds can include, without limitation, p-dichlorobenzene; m-dichlorobenzene; o-dichlorobenzene; 2,5-dichlorotoluene; 1,4-dibromobenzene; 1,4-dichloronaphthalene; 1-methoxy-2,5-dichlorobenzene; 4,4'-dichlorobiphenyl; 3,5-dichlorobenzoic acid; 4,4'-dichlorodiphenyl ether; 4,4'-dichlorodiphenylsulfone; 4,4'-dichlorodiphenylsulfoxide; and 4,4'-dichlorodiphenyl ketone. The halogen atom can be fluorine, chlorine, bromine or iodine, and two halogen atoms in the same dihalo-aromatic compound may be the same or different from each other. In one embodiment, o-dichlorobenzene, m-dichlorobenzene, p-dichlorobenzene or a mixture of two or more compounds thereof is used as the dihalo-aromatic compound. As is known in the art, it is also possible to use a monohalo compound (not necessarily an aromatic compound) in combination with the dihaloaromatic compound in order to form end groups of the polyarylene sulfide or to regulate the polymerization reaction and/or the molecular weight of the polyarylene sulfide.

The polyarylene sulfide(s) may be homopolymers or copolymers. For instance, selective combination of dihaloaromatic compounds can result in a polyarylene sulfide copolymer containing not less than two different units. For instance, when p-dichlorobenzene is used in combination with m-dichlorobenzene or 4,4'-dichlorodiphenylsulfone, a polyarylene sulfide copolymer can be formed containing segments having the structure of formula:

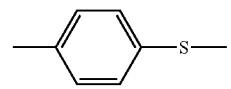

and segments having the structure of formula:

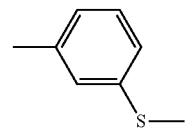

or segments having the structure of formula:

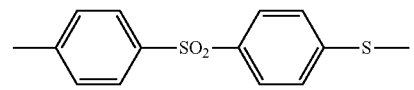

In another embodiment, a polyarylene sulfide copolymer may be formed that includes a first segment with a number-average molar mass Mn of from 1000 to 20,000 g/mol. The first segment may include first units that have been derived from structures of the formula:

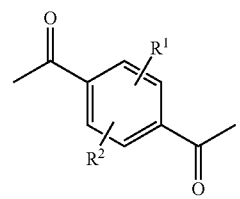

where the radicals $R^1$ and $R^2$, independently of one another, are a hydrogen, fluorine, chlorine or bromine atom or a branched or unbranched alkyl or alkoxy radical having from 1 to 6 carbon atoms; and/or second units that are derived from structures of the formula:

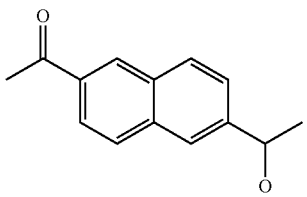 [SMILES: CC(=O)c1ccc2cc(C(C)O)ccc2c1]

The first unit may be p-hydroxybenzoic acid or one of its derivatives, and the second unit may be composed of 2-hydroxynaphthalene-6-carboxylic acid. The second segment may be derived from a polyarylene sulfide structure of the formula:

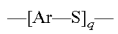

where Ar is an aromatic radical, or more than one condensed aromatic radical, and q is a number from 2 to 100, in particular from 5 to 20. The radical Ar in formula (VII) may be a phenylene or naphthylene radical. In one embodiment, the second segment may be derived from poly(m-thiophenylene), from poly(o-thiophenylene), or from poly(p-thiophenylene).

The polyarylene sulfide(s) may also be linear, semi-linear, branched or crosslinked. Linear polyarylene sulfides typically contain 80 mol % or more of the repeating unit —(Ar—S)—. Such linear polymers may also include a small amount of a branching unit or a cross-linking unit, but the amount of branching or cross-linking units is typically less than about 1 mol % of the total monomer units of the polyarylene sulfide. A linear polyarylene sulfide polymer may be a random copolymer or a block copolymer containing the above-mentioned repeating unit. Semi-linear polyarylene sulfides may likewise have a cross-linking structure or a branched structure introduced into the polymer a small amount of one or more monomers having three or more reactive functional groups. By way of example, monomer components used in forming a semi-linear polyarylene sulfide can include an amount of polyhaloaromatic compounds having two or more halogen substituents per molecule which can be utilized in preparing branched polymers. Such monomers can be represented by the formula R'$X_n$, where each X is selected from chlorine, bromine, and iodine, n is an integer of 3 to 6, and R' is a polyvalent aromatic radical of valence n which can have up to about 4 methyl substituents, the total number of carbon atoms in R' being within the range of 6 to about 16. Examples of some polyhaloaromatic compounds having more than two halogens substituted per molecule that can be employed in forming a semi-linear polyarylene sulfide include 1,2,3-trichlorobenzene, 1,2,4-trichlorobenzene, 1,3-dichloro-5-bromobenzene, 1,2,4-triiodobenzene, 1,2,3,5-tetrabromobenzene, hexachlorobenzene, 1,3,5-trichloro-2,4,6-trimethylbenzene, 2,2',4,4'-tetrachlorobiphenyl, 2,2',5,5'-tetra-iodobiphenyl, 2,2',6,6'-tetrabromo-3,3',5,5'-tetramethylbiphenyl, 1,2,3,4-tetrachloronaphthalene, 1,2,4-tribromo-6-methylnaphthalene, etc., and mixtures thereof.

Regardless of the particular structure, the number average molecular weight of the polyarylene sulfide is typically about 15,000 g/mol or more, and in some embodiments, about 30,000 g/mol or more. The polyarylene sulfide may likewise have a low chlorine content, such as about 1000 ppm or less, in some embodiments about 900 ppm or less, in some embodiments from about 1 to about 600 ppm, and in some embodiments, from about 2 to about 400 ppm.

In addition to mineral filler(s) and polyarylene sulfide(s), the thermoplastic composition used to form the resinous component of the composite structure may also contain a variety of other different components to help improve its overall properties. In one embodiment, for example, the thermoplastic composition may contain a disulfide compound. Without wishing to be bound by any particular theory, the disulfide compound can undergo a polymer scission reaction with a polyarylene sulfide during melt processing, as described in more detail below. This can lower the overall melt viscosity of the composition, which leads to decreased attrition of the filler and thus improved thermal and mechanical properties. When employed, disulfide compounds typically constitute from about 0.01 wt. % to about 3 wt %, in some embodiments from about 0.02 wt. % to about 1 wt. %, and in some embodiments, from about 0.05 to about 0.5 wt. % of the composition. The ratio of the amount of the polyarylene sulfide to the amount of the disulfide compound may likewise be from about 1000:1 to about 10:1, from about 500:1 to about 20:1, or from about 400:1 to about 30:1.

Suitable disulfide compounds are typically those having the following formula:

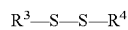

wherein $R^3$ and $R^4$ may be the same or different and are hydrocarbon groups that independently include from 1 to about 20 carbons. For instance, $R^3$ and $R^4$ may be an alkyl, cycloalkyl, aryl, or heterocyclic group. In certain embodiments, $R^3$ and $R^4$ are generally nonreactive functionalities, such as phenyl, naphthyl, ethyl, methyl, propyl, etc. Examples of such compounds include diphenyl disulfide, naphthyl disulfide, dimethyl disulfide, diethyl disulfide, and dipropyl disulfide. $R^3$ and $R^4$ may also include reactive functionality at terminal end(s) of the disulfide compound. For example, at least one of $R^3$ and $R^4$ may include a terminal carboxyl group, hydroxyl group, a substituted or non-substituted amino group, a nitro group, or the like. Examples of compounds may include, without limitation, 2,2'-diaminodiphenyl disulfide, 3,3'-diaminodiphenyl disulfide, 4,4'-diaminodiphenyl disulfide, dibenzyl disulfide, dithiosalicyclic acid, dithioglycolic acid, α,α'-dithiodilactic acid, β,β'-dithiodilactic acid, 3,3'-dithiodipyridine, 4,4' dithiomorpholine, 2,2'-dithiobis(benzothiazole), 2,2'-dithiobis(benzimidazole), 2,2'-dithiobis(benzoxazole) and 2-(4'-morpholinodithio)benzothiazole.

Fibrous fillers may also be employed in the thermoplastic composition. When employed, such fibrous fillers typically constitute from about 5 wt. % to about 40 wt. %, in some embodiments from about 10 wt. % to about 35 wt. %, and in some embodiments, from about 10 wt. % to about 30 wt. % of the composition. The fibrous fillers may include one or more fiber types including, without limitation, polymer fibers, glass fibers, carbon fibers, metal fibers, and so forth, or a combination of fiber types. In one embodiment, the fibers may be chopped glass fibers or glass fiber rovings (tows). Fiber diameters can vary depending upon the particular fiber used and are available in either chopped or continuous form. The fibers, for instance, can have a diameter of less than about 100 μm, such as less than about 50 μm. For instance, the fibers can be chopped or continuous fibers and can have a fiber diameter of from about 5 μm to about 50 μm, such as from about 5 μm to about 15 μm. Fiber lengths can vary. In one embodiment, the fibers can have an initial length of from about 3 mm to about 5 mm. Due to the combination of the optional disulfide compound with the polyarylene sulfide, excessive degradation of the fibers can be minimized during mixing. As a result, the fibers can show little attrition so that the final fiber length in the thermoplastic composition is, for instance, from about 200 μm to about 1500 μm, or from about 250 μm to about 1000 μm.

Still another suitable additive that may be employed in the composition can include an organosilane coupling agent. In certain embodiments, interaction between a disulfide compound and an organosilane coupling agent, for instance, may enhance the benefits of the filler in the thermoplastic composition. When employed, organosilane coupling agent(s) typically constitute from about 0.1 wt. % to about 5 wt. %, in some embodiments from about 0.3 wt. % to about 2 wt. % by, and in some embodiments, from about 0.2 wt. % to about 1 wt. % of the composition.

The organosilane coupling agent may be any alkoxy silane coupling agent as is known in the art, such as vinlyalkoxysilanes, epoxyalkoxysilanes, aminoalkoxysilanes, mercaptoalkoxysilanes, and combinations thereof. Aminoalkoxysilane compounds typically have the formula: $R^5$—Si—$(R^6)_3$, wherein $R^5$ is selected from the group consisting of an amino group such as $NH_2$; an aminoalkyl of from about 1 to about 10 carbon atoms, or from about 2 to about 5 carbon atoms, such as aminomethyl, aminoethyl, aminopropyl, aminobutyl, and so forth; an alkene of from about 2 to about 10 carbon atoms, or from about 2 to about 5 carbon atoms, such as ethylene, propylene, butylene, and so forth; and an alkyne of from about 2 to about 10 carbon atoms, or from about 2 to about 5 carbon atoms, such as ethyne, propyne, butyne and so forth; and wherein $R^6$ is an alkoxy group of from about 1 to about 10 atoms, or from about 2 to about 5 carbon atoms, such as methoxy, ethoxy, propoxy, and so forth. In one embodiment, $R^5$ is selected from the group consisting of aminomethyl, aminoethyl, aminopropyl, ethylene, ethyne, propylene and propyne, and $R^6$ is selected from the group consisting of methoxy groups, ethoxy groups, and propoxy groups. In another embodiment, $R^5$ is selected from the group consisting of an alkene of from about 2 to about 10 carbon atoms such as ethylene, propylene, butylene, and so forth, and an alkyne of from about 2 to about 10 carbon atoms such as ethyne, propyne, butyne and so forth, and $R^6$ is an alkoxy group of from about 1 to about 10 atoms, such as methoxy group, ethoxy group, propoxy group, and so forth. A combination of various aminosilanes may also be included in the mixture.

Some representative examples of aminosilane coupling agents that may be included in the mixture include aminopropyl triethoxy silane, aminoethyl triethoxy silane, aminopropyl trimethoxy silane, aminoethyl trimethoxy silane, ethylene trimethoxy silane, ethylene triethoxy silane, ethyne trimethoxy silane, ethyne triethoxy silane, aminoethylaminopropyltrimethoxy silane, 3-aminopropyl triethoxy silane, 3-aminopropyl trimethoxy silane, 3-aminopropyl methyl dimethoxysilane or 3-aminopropyl methyl diethoxy silane, N-(2-aminoethyl)-3-aminopropyl trimethoxy silane, N-methyl-3-aminopropyl trimethoxy silane, N-phenyl-3-aminopropyl trimethoxy silane, bis(3-aminopropyl)tetramethoxy silane, bis(3-aminopropyl)tetraethoxy disiloxane, and combinations thereof. The amino silane may also be an aminoalkoxysilane, such as γ-aminopropyltrimethoxysilane, raminopropyltriethoxysilane, γ-aminopropylmethyldimethoxysilane, γ-aminopropylmethyldiethoxysilane, N-(β-aminoethyl)-γ-aminopropyltrimethoxysilane, N-phenyl-γ-aminopropyltrimethoxysilane, γ-diallylaminopropyltrimethoxysilane and γ-diallylaminopropyltrimethoxysilane. One suitable amino silane is 3-aminopropyltriethoxysilane which is available from Degussa, Sigma Chemical Company, and Aldrich Chemical Company.

An impact modifier may also be employed in the composition if desired. In one embodiment, the impact modifier may comprise a random copolymer of polyethylene and glycidyl methacrylate. The amount of glycidyl methacrylate contained in the random copolymer may vary. In one particular embodiment, the random copolymer contains the glycidyl methacrylate in an amount from about 6% to about 10% by weight of the copolymer. Other impact modifiers may include polyurethanes, two-phase mixtures of polybutadiene and styrene-acrylonitrile (ABS), modified polysiloxanes or silicone rubbers, or graft copolymers of an elastomeric, single-phase core based on polydiene and of a hard graft shell (core-shell structure). Still other additives that can be included in the composition may include, for instance, antimicrobials, pigments, lubricants, antioxidants, stabilizers, surfactants, waxes, flow promoters, solid solvents, and other materials added to enhance properties and processability.

The materials used to form the thermoplastic composition may be combined together using any of a variety of different techniques as is known in the art. In one particular embodiment, for example, the polyarylene sulfide(s), mineral filler(s), and other optional components are melt processed as a mixture within an extruder to form the thermoplastic composition. One benefit of such a technique is that it can initiate a reaction with the optional disulfide compound with the polyarylene sulfide to lower the melt viscosity of the composition. The mixture may be melt-kneaded in a single-screw or multi-screw extruder at a temperature of from about 250° C. to about 320° C. In one embodiment, the mixture may be melt processed in an extruder that includes multiple temperature zones. By way of example, the mixture may be melt processed using a twin screw extruder such as a Leistritz 18 mm co-rotating fully intermeshing twin screw extruder. A general purpose screw design can be used to melt process the mixture. In one embodiment, the mixture including all of the components may be fed to the feed throat in the first barrel by means of a volumetric feeder. In another embodiment, different components may be added at different addition points in the extruder, as is known. The mixture can be melted and mixed then extruded through a die. The extruded thermoplastic composition can then be quenched in a water bath to solidify and granulated in a pelletizer followed by drying, e.g., drying at about 120° C.

The resulting thermoplastic composition may have a relatively low melt viscosity so that it can be easily molded into the desired shape. The melt viscosity may, for instance, be about 5 kilopoise or less, in some embodiments from about 0.5 to about 4 kilopoise, and in some embodiments, from about 1 to about 3 kilopoise, as determined in accordance with ISO Test No. 11443 at a shear rate of 1200 $s^{-1}$ and at a temperature of 316° C.

Once formed, the thermoplastic composition is integrated with the metal component to form the composite structure of the present invention. This is accomplished by "overmolding" the thermoplastic composition onto a portion or the entire surface of the metal component so that it forms a resinous component that is adhered thereto. The metal component may contain any of a variety of different metals, such as aluminum, stainless steel, magnesium, nickel, chromium, copper, titanium, and alloys thereof. As indicated above, magnesium-aluminum alloys are particularly suitable for use in the metal component. Such alloys typically contain from 0.5 wt. % to 15 wt. % aluminum and 85 wt. % to 99.5 wt. % magnesium. The metal component may be shaped using known techniques, such as casting, forging, etc., and may possess any desired shape or size depending on the intended use of the composite structure.

The thermoplastic composition generally adheres to the metal component during overmolding by flowing within and/ or around surface indentations or pores of the metal component. To improve adhesion, the metal component may optionally be pretreated to increase the degree of surface indentations and surface area. This may be accomplished using mechanical techniques (e.g., sandblasting, grinding, flaring, punching, molding, etc.) and/or chemical techniques (e.g., etching, anodic oxidation, etc.). For instance, techniques for anodically oxidizing a metal surface are described in more detail in U.S. Pat. No. 7,989,079 to Lee, et al. In addition to pretreating the surface, the metal component may also be preheated at a temperature close to, but below the melt temperature of the thermoplastic composition. This may be accomplished using a variety of techniques, such as contact heating, radiant gas heating, infrared heating, convection or forced convection air heating, induction heating, microwave heating or combinations thereof. In any event, the thermoplastic composition is generally injected into a mold that contains the optionally preheated metal component. Once formed into the desired shape, the composite structure is allowed to cool so that the resinous component becomes firmly adhered to the metal component.

Although not required, additional mechanisms may also be employed to help ensure good adherence between the resinous and metal components of the composite structure. For example, latching portions, such as hooks, bolts, screws, rivets, etc., may be employed in certain embodiments. Examples of other suitable latching mechanisms are described in U.S. Patent Publication Nos. 2009/0267266 to Lee, et al. In yet other embodiments, an adhesive may be employed between the resinous and metal components. Examples of suitable adhesives are described, for instance, in U.S. Patent Publication No. 2011/0090630 to Bergeron.

If desired, the overmolded composite structure of the present invention may be subjected to one or more surface treatments after it is formed. In one embodiment, for example, a coating composition may be applied to a surface of the composite structure using known techniques, such as spraying, painting, etc. The coating composition may serve a variety of different functions, such as improving the adhesion strength between the components, improving the uniformity of the appearance of the composite structure, removing dust, etc. Cleaning can be carried out with a detergent, a solvent, an acid or an alkali, or a removal treatment of rust or burrs with a derusting agent, by a physical method (sand blasting, honing or the like) or a high-temperature heating treatment. Color treatments may also be carried out with a coating composition containing, for instance, a film-forming polymer, pigment, solvent, etc. Suitable film-forming polymers may include polyolefins, polyvinyl chloride, polystyrene, polyurethane, acrylonitrile-butadiene-styrene, polymethyl methacrylate, polycarbonate, polytetyafluoroethylene, polyimide, etc. Likewise, suitable pigments may include titanium dioxide, carbon black, iron oxide red, etc. Other additives can also be employed, such as lubricants, stabilizer, flame retardants, etc. In many cases, the composite structure and/or the coating composition is heated during its application. Due to the closely matched thermal properties of the resinous and metal components, the composite structure may remain relatively stable during the coating operation, thereby minimizing the number of steps which may be required to achieve the desired properties.

The overmolded composite structure of the present invention may be used in a wide variety of applications, such as components for automobiles, trucks, commercial airplanes, aerospace, rail, household appliances, computer hardware, hand held devices, recreation and sports, structural component for machines, structural components for buildings, etc. Suitable electronic device may include, for instance, wireless devices, capacitors (e.g., as a cap for the capacitor), electrical connectors, processors, etc.

Wireless electronic devices, however, are particularly suitable. For example, the overmolded composite structure may serve as a housing for a wireless electronic device. In such embodiments, an antenna may be disposed on and/or within the metal component prior to overmolding. The metallic component itself may also be used as part of the antenna. For example, portions of the metal component may be shorted together to form a ground plane in or to expand a ground plane structure that is formed from a planar circuit structure, such as a printed circuit board structure (e.g., a printer circuit board structure used in forming antenna structures). Alternatively, the antenna may also be embedded within the resinous component during the molding process. Examples of such embedded antennas are described, for instance, in U.S. Pat. No. 7,518,568 to Tracy, et al. Other discrete components can also be embedded within the resinous component, such as metal stampings, bushings, electromechanical parts, filtration materials, metal reinforcement and other discrete parts that are combined into a single unitary component through the injection of thermoplastic around the carefully placed parts.

Examples of suitable wireless electronic devices may include a desktop computer or other computer equipment, a portable electronic device, such as a laptop computer or small portable computer of the type that is sometimes referred to as "ultraportables." In one suitable arrangement, the portable electronic device may be a handheld electronic device. Examples of portable and handheld electronic devices may include cellular telephones, media players with wireless communications capabilities, handheld computers (also sometimes called personal digital assistants), remote controls, global positioning system ("GPS") devices, and handheld gaming devices. The device may also be a hybrid device that combines the functionality of multiple conventional devices. Examples of hybrid devices include a cellular telephone that includes media player functionality, a gaming device that includes a wireless communications capability, a cellular telephone that includes game and email functions, and a handheld device that receives email, supports mobile telephone calls, has music player functionality and supports web browsing.

Figure 2:
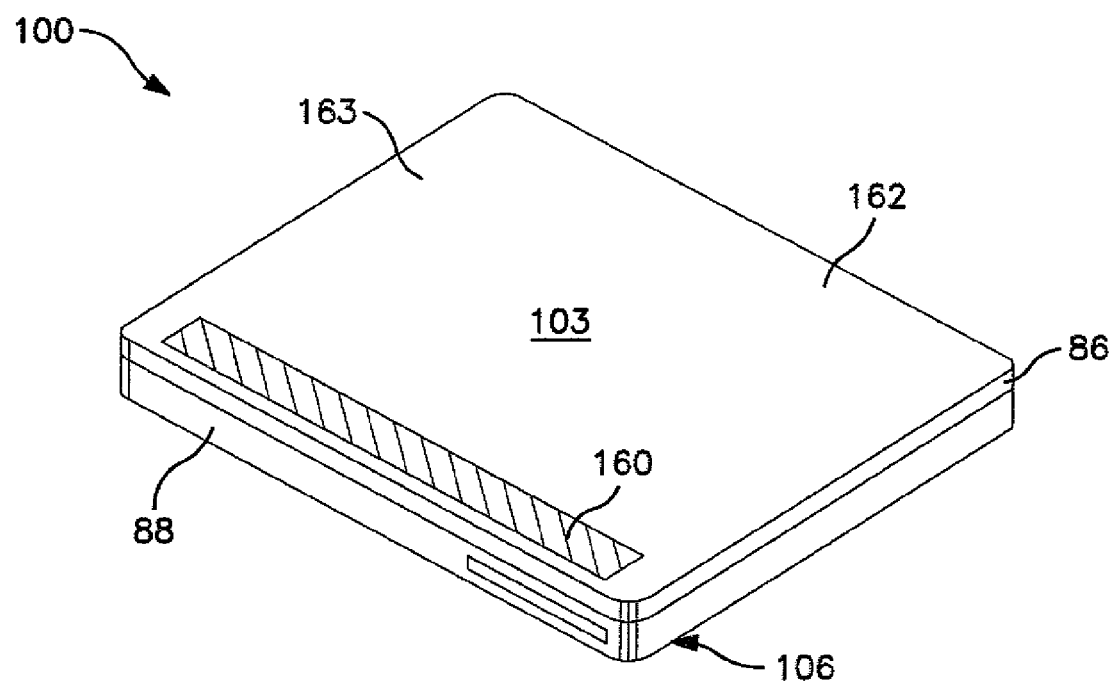
FIG. 2 is a perspective view of the electronic device of FIG. 1, shown in a closed configuration.

Referring to FIGS. 1-2, one particular embodiment of a wireless electronic device 100 is shown as a laptop computer. The electronic device 100 includes a display member 103 rotatably coupled to a base member 106. The display member 103 may be a liquid crystal diode (LCD) display, an organic light emitting diode (OLED) display, a plasma display, or any other suitable display. The display member 103 and the base member 106 each contain a housing 86 and 88, respectively, for protecting and/or supporting one or more components of the electronic device 100. The housing 86 may, for example, support a display screen 120 and the base member 106 may include cavities and interfaces for various user interface components (e.g. keyboard, mouse, and connections to other peripheral devices).

The overmolded composite structure may generally be employed to form any portion of the electronic device 100. In most embodiments, however, the composite structure is employed to form all or a portion of the housing 86 and/or 88. For example, the housing 86 shown in FIG. 2 is formed from the overmolded composite structure and contains a resinous component 160 adhered to an interior surface (not shown) of a metal component 162. In this particular embodiment, the resinous component 160 is in the form of a strip, which may optionally cover an antenna (not shown) located in the housing 86. Of course, the antenna and/or resinous component 160 may be disposed at other location of the housing 86, such as adjacent to a corner, along an edge, or in any other suitable position. Regardless, the resulting composite structure formed by the resinous component 160 and the metal component 162 defines an exterior surface 163 of the housing 86. The exterior surface 163 is generally smooth, and is indicated above, has a similar color and visual appearance.

Although not expressly shown, the device 100 may also contain circuitry as is known in the art, such as storage, processing circuitry, and input-output components. Wireless transceiver circuitry in circuitry may be used to transmit and receive radio-frequency (RF) signals. Communications paths such as coaxial communications paths and microstrip communications paths may be used to convey radio-frequency signals between transceiver circuitry and antenna structures. A communications path may be used to convey signals between the antenna structure and circuitry. The communications path may be, for example, a coaxial cable that is connected between an RF transceiver (sometimes called a radio) and a multiband antenna.

Test Methods

Melt Viscosity:

The melt viscosity is reported as scanning shear rate viscosity. Scanning shear rate viscosity as reported herein is determined in accordance with ISO Test No. 11443 (technically equivalent to ASTM D3835) at a shear rate of 1200 s-1 and at a temperature of 316° C. using a Dynisco 7001 capillary rheometer. The rheometer orifice (die) has a diameter of 1 mm, a length of 20 mm, an UD ratio of 20.1, and an entrance angle of 180°. The diameter of the barrel is 9.55 mm+0.005 mm and the length of the rod was 233.4 mm.

Tensile Modulus, Tensile Stress, and Tensile Elongation:

Tensile properties are tested according to ISO Test No. 527 (technically equivalent to ASTM D638). Modulus and strength measurements are made on the same test strip sample having a length of 80 mm, thickness of 10 mm, and width of 4 mm. The testing temperature is 23° C., and the testing speeds are 1 or 5 mm/min.

Flexural Modulus, Flexural Stress, and Flexural Strain:

Flexural properties are tested according to ISO Test No. 178 (technically equivalent to ASTM D790). This test is performed on a 64 mm support span. Tests are run on the center portions of uncut ISO 3167 multi-purpose bars. The testing temperature is 23° C. and the testing speed is 2 mm/min.

Izod Notched Impact Strength:

Notched Izod properties are tested according to ISO Test No. 80 (technically equivalent to ASTM D256). This test is run using a Type A notch. Specimens are cut from the center of a multi-purpose bar using a single tooth milling machine. The testing temperature is 23° C.

Deflection Under Load Temperature ("DTUL"):

The deflection under load temperature is determined in accordance with ISO Test No. 75-2 (technically equivalent to ASTM D648-07). A test strip sample having a length of 80 mm, thickness of 10 mm, and width of 4 mm is subjected to an edgewise three-point bending test in which the specified load (maximum outer fibers stress) is 1.8 MPa. The specimen is lowered into a silicone oil bath where the temperature is raised at 2° C. per minute until it deflects 0.25 mm (0.32 mm for ISO Test No. 75-2).

Chlorine Content:

Chlorine content is determined according to an elemental analysis using Parr Bomb combustion followed by Ion Chromatography.

CIELAB Test:

Color measurement is performed using a DataColor 600 Spectrophotometer utilizing an integrating sphere with measurements made using the specular included mode. Color coordinates are calculated according to ASTM D2244-11 under an illuminant D65/10°, A/10°, or F2/10° observer, using CIELAB units.

The present invention may be better understood with reference to the following examples.

Example 1

The ability to form a thermoplastic composition that can be used as a resinous component in an overmolded composite structure is demonstrated. More particularly, the components listed in the table below are mixed in a Werner Pfieiderer ZSK 25 co-rotating intermeshing twin-screw extruder with a 25 mm diameter.

| Components | Sample #1 | Sample #2 |
|---|---|---|
| Glycolube P | 0.3 wt. % | 0.3 wt. % |
| Aminosilane Coupling Agent | 0.3 wt. % | 0.3 wt. % |
| Diphenyl sulfide | 0.1 wt. % | 0.1 wt. % |
| Talc | — | 15.0 wt. % |
| Mica | 30.0 wt. % | 15.0 wt. % |
| Fiberglass (4 mm) | 20.0 wt. % | 20.0 wt. % |
| FORTRON ® 0214 PPS | 49.3 wt. % | 49.3 wt. % |

Parts are then molded from each sample on a Mannesmann Demag D100 NCIII injection molding machine and tested. The results are set forth below.

| Components | Sample #1 | Sample #2 |
|---|---|---|
| Melt Viscosity (316° C., 1200 s$^{-1}$) | 2.4 kilopoise | 2.5 kilopoise |
| Tensile Modulus (1 mm/min) | 16,993 MPa | 15,702 MPa |
| Tensile Stress (5 mm/min) | 126 MPa | 121 MPa |
| Tensile Strain (5 mm/min) | 1.17% | 1.21% |
| Flexural Modulus (at 23° C.) | 17,290 MPa | 16,254 MPa |
| Flexural Stress | 183.57 MPa | 182.40 Mpa |
| Flexural Strain | 1.24% | 1.36% |
| Izod Notched Impact Strength | 4.8 kJ/m$^2$ | 4.8 kJ/m$^2$ |
| DTUL | 262° C. | 267° C. |
| Coefficient of Linear Thermal Expansion (parallel) | 18.68 μm/m° C. | 19.92 μm/m° C. |
| Coefficient of Linear Thermal Expansion (normal) | 42.23 μm/m° C. | 38.50 μm/m° C. |
| Chlorine Content | 850 ppm | 690 ppm |

As indicated above, the samples of the present invention have a coefficient of linear thermal expansion relatively close to that of a conventional Mg—Al alloy (AZ91D Mg—Al alloy, coefficient of linear thermal expansion (parallel)=27 μm/m° C.). This is accomplished without sacrificing mechanical properties. The color difference is also compared to the Mg—Al alloy using CIELAB testing as described above. The results are set forth below.

| Sample | Test Condition | ΔL* | Δa* | Δb* | ΔC* | ΔH* | ΔE* |
|---|---|---|---|---|---|---|---|
| 1 | D65 10° | −11.05 | 1.64 | 0.08 | 0.57 | −1.54 | 11.18 |
|   | A 10° | −11.87 | 1.23 | 0.66 | 1.10 | −0.86 | 10.96 |
|   | F2 10° | −10.88 | 1.08 | 0.19 | 0.38 | −1.03 | 10.94 |
| 2 | D65 10° | 4.70 | 1.22 | 0.43 | 0.71 | −1.08 | 4.87 |
|   | A 10° | 4.86 | 1.00 | 0.88 | 1.19 | −0.60 | 5.04 |
|   | F2 10° | 4.85 | 0.79 | 0.54 | 0.64 | −0.71 | 4.94 |

As indicated, each sample tested has a ΔE* of less than 12, which signifies that the samples have a relatively similar color to the Mg—Al alloy.

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. An overmolded composite structure for an electronic device, the composite structure comprising:
    a metal component that defines a surface;
    a resinous component that is adhered to the surface of the metal component, wherein the resinous component is formed from a thermoplastic composition that comprises a polyarylene sulfide and a mineral filler, wherein the ratio of the coefficient of linear thermal expansion of the resinous component to the coefficient of linear thermal expansion of the metal component is from about 0.5 to about 1.5.

2. The overmolded composite structure of claim 1, wherein the ratio of the coefficient of linear thermal expansion of the resinous component to the coefficient of linear thermal expansion of the metal component is from about 0.6 to about 1.0.

3. The overmolded composite structure of claim 1, wherein the coefficient of linear thermal expansion of the resinous component is from about 10 μm/m° C. to about 35 μm/m° C.

4. The overmolded composite structure of claim 1, wherein the coefficient of linear thermal expansion of the resinous component is from about 18 μm/m° C. to about 30 μm/m° C.

5. The overmolded composite structure of claim 4, wherein the coefficient of linear thermal expansion of the metal component is about 27 μm/m° C.

6. The overmolded composite structure of claim 1, wherein the metal component has a first color and the resinous component has a second color that is similar to the first color.

7. The overmolded composite structure of claim 6, wherein the difference between the first color and the second color is about 12 or less as determined by the CIELAB test and represented by ΔE in the following equation:

$$\Delta E = [(\Delta L^*)^2 + (\Delta a^*)^2 + (\Delta b^*)^2]^{1/2}$$

wherein,

ΔL* is the luminosity value L* of the first color subtracted from the luminosity value L* of the second color, wherein L* ranges from 0 to 100, where 0=dark and 100=light;

Δa* is the red/green axis value a* of the first color subtracted from the red/green axis value a* of the second color, wherein a* ranges from −100 to 100, and where positive values are reddish and negative values are greenish; and Δb* is the yellow/blue axis value b* of the first color subtracted from the yellow/blue axis value b* of the second color, wherein b* ranges from −100 to 100, and where positive values are yellowish and negative values are bluish.

8. The overmolded composite structure of claim 6, wherein the difference between the first color and the second color is from about 1 to about 6 as determined by the CIELAB test and represented by ΔE in the following equation:

$$\Delta E = [(\Delta L^*)^2 + (\Delta a^*)^2 + (\Delta b^*)^2]^{1/2}$$

wherein,

ΔL* is the luminosity value L* of the first color subtracted from the luminosity value L* of the second color, wherein L* ranges from 0 to 100, where 0=dark and 100=light;

Δa* is the red/green axis value a* of the first color subtracted from the red/green axis value a* of the second color, wherein a* ranges from −100 to 100, and where positive values are reddish and negative values are greenish; and Δb* is the yellow/blue axis value b* of the first color subtracted from the yellow/blue axis value b* of the second color, wherein b* ranges from −100 to 100, and where positive values are yellowish and negative values are bluish.

9. The overmolded composite structure of claim 1, wherein the ratio of polyarylene sulfides to mineral fillers in the thermoplastic composition is from about 0.5 to about 5.

10. The overmolded composite structure of claim 1, wherein the ratio of polyarylene sulfides to mineral fillers in the thermoplastic composition is from about 1 to about 2.

11. The overmolded composite structure of claim 1, wherein mineral fillers constitute from about 5 wt. % to about 50 wt. % of the thermoplastic composition and polyarylene sulfides constitute from about 20 wt. % to about 70 wt. % of the thermoplastic composition.

12. The overmolded composite structure of claim 1, wherein mineral fillers constitute from about 20 wt. % to about 40 wt. % of the thermoplastic composition and polyarylene sulfides constitute from about 45 wt. % to about 60 wt. % of the thermoplastic composition.

13. The overmolded composite structure of claim 1, wherein the mineral filler includes a magnesium-based clay mineral.

14. The overmolded composite structure of claim 13, wherein the magnesium-based clay mineral includes talc.

15. The overmolded composite structure of claim 13, wherein the mineral filler further includes mica.

16. The overmolded composite structure of claim 15, wherein the mica is a magnesium-based mica.

17. The overmolded composite structure of claim 1, wherein the polyarylene sulfide is polyphenylene sulfide.

18. The overmolded composite structure of claim 1, wherein the thermoplastic composition further comprises a disulfide compound, fibrous filler, organosilane coupling agent, impact modifier, or a combination thereof.

19. The overmolded composite structure of claim 1, wherein the thermoplastic composition has a melt viscosity of about 5 kilopoise or less, as determined in accordance with ISO Test No. 11443 at a shear rate of $1200 \text{ s}^{-1}$ and at a temperature of 316° C.

20. The overmolded composite structure of claim 1, wherein the metal component includes aluminum, stainless steel, magnesium, nickel, chromium, copper, titanium, or an alloy thereof.

21. The overmolded composite structure of claim 20, wherein the metal component includes a magnesium-aluminum alloy.

22. A wireless electronic device that comprises the overmolded composite structure of claim 1.

23. The wireless electronic device of claim 22, wherein the overmolded composite structure is a housing for the device, and wherein the housing includes an antenna that is covered by the resinous component.

24. A laptop computer comprising a display member rotatably coupled to a base member, wherein the display member includes a housing that contains an overmolded composite structure, wherein the overmolded composite structure comprises:
 a metal component that defines a surface;
 a resinous component that is adhered to the surface of the metal component, wherein the resinous component is formed from a thermoplastic composition that comprises a polyarylene sulfide and a mineral filler, wherein the ratio of the coefficient of linear thermal expansion of the resinous component to the coefficient of linear thermal expansion of the metal component is from about 0.5 to about 1.5.

25. The laptop computer of claim 24, wherein the ratio of the coefficient of linear thermal expansion of the resinous component to the coefficient of linear thermal expansion of the metal component is from about 0.6 to about 1.0.

26. The laptop computer of claim 24, wherein the coefficient of linear thermal expansion of the resinous component is from about 10 μm/m° C. to about 35 μm/m° C.

27. The laptop computer of claim 26, wherein the coefficient of linear thermal expansion of the metal component is about 27 μm/m° C.

28. The laptop computer of claim 24, wherein the metal component has a first color and the resinous component has a second color, wherein the difference between the first color and the second color is about 12 or less as determined by the CIELAB test and represented by ΔE in the following equation:

$$\Delta E = [(\Delta L^*)^2 + (\Delta a^*)^2 + (\Delta b^*)^2]^{1/2}$$

wherein,
 $\Delta L^*$ is the luminosity value $L^*$ of the first color subtracted from the luminosity value $L^*$ of the second color, wherein $L^*$ ranges from 0 to 100, where 0=dark and 100=light;
 $\Delta a^*$ is the red/green axis value $a^*$ of the first color subtracted from the red/green axis value $a^*$ of the second color, wherein $a^*$ ranges from −100 to 100, and where positive values are reddish and negative values are greenish; and
 $\Delta b^*$ is the yellow/blue axis value $b^*$ of the first color subtracted from the yellow/blue axis value $b^*$ of the second color, wherein $b^*$ ranges from −100 to 100, and where positive values are yellowish and negative values are bluish.

29. The laptop computer of claim 24, wherein the ratio of polyarylene sulfides to mineral fillers in the thermoplastic composition is from about 0.5 to about 5.

30. The laptop computer of claim 24, wherein mineral fillers constitute from about 5 wt. % to about 50 wt. % of the thermoplastic composition and polyarylene sulfides constitute from about 20 wt. % to about 70 wt. % of the thermoplastic composition.

31. The laptop computer of claim 24, wherein the mineral filler includes talc.

32. The laptop computer of claim 31, wherein the mineral filler further includes mica.

33. The laptop computer of claim 24, wherein the polyarylene sulfide is polyphenylene sulfide.

34. The laptop computer of claim 24, wherein the metal component includes a magnesium-aluminum alloy.

35. The laptop computer of claim 24, wherein the housing includes an antenna that is covered by the resinous component.

36. The laptop computer of claim 24, wherein the resinous component is in the form of a strip.

37. The laptop computer of claim 24, wherein the overmolded composite structure defines an exterior surface of the housing.

* * * * *

UNITED STATES PATENT AND TRADEMARK OFFICE
CERTIFICATE OF CORRECTION

PATENT NO. : 8,663,764 B2
APPLICATION NO. : 13/621874
DATED : March 4, 2014
INVENTOR(S) : Rong Luo and Xinyu Zhao It is certified that error appears in the above-identified patent and that said Letters Patent is hereby corrected as shown below:

On Title Page 2, Item (56), Under Foreign Patent Documents

"JP3837715 B 4/2005" should read --JP 3637715 B 4/2005--

Signed and Sealed this
Twelfth Day of August, 2014

Michelle K. Lee
*Deputy Director of the United States Patent and Trademark Office*